United States Patent
Obeng et al.

(10) Patent No.: US 7,723,199 B2
(45) Date of Patent: May 25, 2010

(54) METHOD FOR CLEANING POST-ETCH NOBLE METAL RESIDUES

(75) Inventors: Yaw S. Obeng, Frisco, TX (US); Kezhakkedath R. Udayakumar, Dallas, TX (US); Scott Robert Summerfelt, Garland, TX (US); Sanjeev Aggarwal, Scottsdale, AZ (US); Francis Gabriel Celii, Dallas, TX (US); Lindsey H. Hall, Plano, TX (US); Robert Kraft, Plano, TX (US); Theodore S. Moise, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 468 days.

(21) Appl. No.: 11/669,759

(22) Filed: Jan. 31, 2007

(65) Prior Publication Data

US 2007/0298521 A1 Dec. 27, 2007

Related U.S. Application Data

(60) Provisional application No. 60/805,406, filed on Jun. 21, 2006.

(51) Int. Cl.
*H01L 21/02* (2006.01)

(52) U.S. Cl. .......................... 438/381; 438/3; 438/240; 257/E21.008

(58) Field of Classification Search ..................... 438/3, 438/240, 381; 257/E21.008
See application file for complete search history.

(56) References Cited

U.S. PATENT DOCUMENTS

| 6,500,678 B1 * | 12/2002 | Aggarwal et al. | 438/3 |
| 6,533,948 B2 * | 3/2003 | Kato et al. | 216/6 |
| 2006/0134808 A1 | 6/2006 | Summerfelt | |

* cited by examiner

*Primary Examiner*—Marcos D. Pizarro
(74) *Attorney, Agent, or Firm*—Warren L. Franz; Wade J. Brady, III; Frederick J. Telecky, Jr.

(57) ABSTRACT

A method of manufacturing a semiconductor device is presented. In one aspect, the method comprises forming conductive and ferroelectric material layers on a semiconductor substrate. The material layers are patterned to form electrodes and a ferroelectric layer of a ferroelectric capacitor, wherein a conductive noble metal-containing polymer is generated on sidewalls of the ferroelectric capacitor. The method also comprises converting the conductive noble metal-containing polymer into a non-conducting metal oxide. Converting includes forming a water-soluble metal salt from the conductive noble metal-containing polymer and reacting the water-soluble metal salt with an acqueous acidic solution to form a metal hydroxide. Converting also includes oxidizing the metal hydroxide to form the non-conducting metal oxide.

28 Claims, 7 Drawing Sheets

METHOD FOR CLEANING POST-ETCH NOBLE METAL RESIDUES

CROSS-REFERENCES

This application claims the benefit of U.S. Provisional Application No. 60/805,406 entitled "METHOD FOR CLEANING POST-ETCH MOBLE METAL RESIDUES" to Obeng, et al., filed on Jun. 21, 2006, which is incorporated herein by reference as if reproduced herein in its entirety.

TECHNICAL FIELD

The invention is directed, in general to semiconductor devices, and more specifically, to methods for cleaning etched capacitor structures in the fabrication of semiconductor devices.

BACKGROUND

Noble metals are being increasingly used in the fabrication of various MEMS and IC semiconductor devices. E.g., noble metals are often used in the construction of components of capacitors used in ferroelectric memory cells (FRAM). Unfortunately, the patterning of such noble metal can be problematic. E.g., the etching of noble metals can leave behind a conductive by-product which short-circuits a device component. Consequently, capacitors that comprise components formed from patterned noble metals may not retain their charge because conductive by-products formed on sidewalls of the capacitor provide a route for current leakage.

Accordingly, what is needed is a method for manufacturing semiconductor devices that includes noble metals and that addresses the drawbacks of the prior art methods and devices.

SUMMARY

Various embodiments of a method of manufacturing a semiconductor device are provided herein. In one embodiment, the method comprises forming conductive and ferroelectric material layers on a semiconductor substrate. The material layers are patterned to form electrodes and a ferroelectric layer of a ferroelectric capacitor, wherein a conductive noble metal-containing polymer is generated on sidewalls of the ferroelectric capacitor. The method also comprises converting the conductive noble metal-containing polymer into a non-conducting metal oxide. Converting includes forming a water-soluble metal salt from the conductive noble metal-containing polymer, and reacting the water-soluble metal salt with an aqueous acidic solution to form a metal hydroxide. Converting also includes oxidizing the metal hydroxide to form the non-conducting metal oxide.

Another embodiment comprises a method of manufacturing an integrated circuit. The method comprises forming one or more transistors on a semiconductor substrate and depositing a pre-metal dielectric layer over the transistors. The method also comprises fabricating a ferroelectric capacitor on the semiconductor substrate. The ferroelectric capacitor is electrically coupled to at least one of the transistors. Fabricating the ferroelectric capacitor includes forming conductive and ferroelectric material layers on the pre-metal dielectric layer, and patterning the material layers to form electrodes and a ferroelectric layer of the ferroelectric capacitor. A conductive noble metal-containing polymer is generated on sidewalls of the ferroelectric capacitor. Fabricating the ferroelectric capacitor includes converting the conductive noble metal-containing polymer into a non-conducting metal oxide, as described above.

Still another embodiment comprises an integrated circuit. The integrated circuit comprises one or more memory cells. At least one of the memory cells includes one or more transistors on or in a semiconductor substrate, a pre-metal dielectric layer over the transistor and a ferroelectric capacitor on the pre-metal dielectric layer. The ferroelectric capacitor is electrically coupled to at least one of the transistors and includes sidewalls having a non-conducting metal oxide thereon. The non-conducting metal oxide thereon is converted from a conductive noble metal-containing polymer by the processes described above.

DETAILED DESCRIPTION

Previous efforts to remove or clean-away conductive by-products resulting from the etching of noble metals have not been entirely successful, leading to lower-than-desired yields of devices. Embodiments of this disclosure take an alternative approach. Rather than removing conductive by-products, the conductive by-products are converted into non-conducting metal oxides. Thus, even though they remain on the device components, the non-conducting metal oxides do not short-out or cause current leakage.

Figure 1:
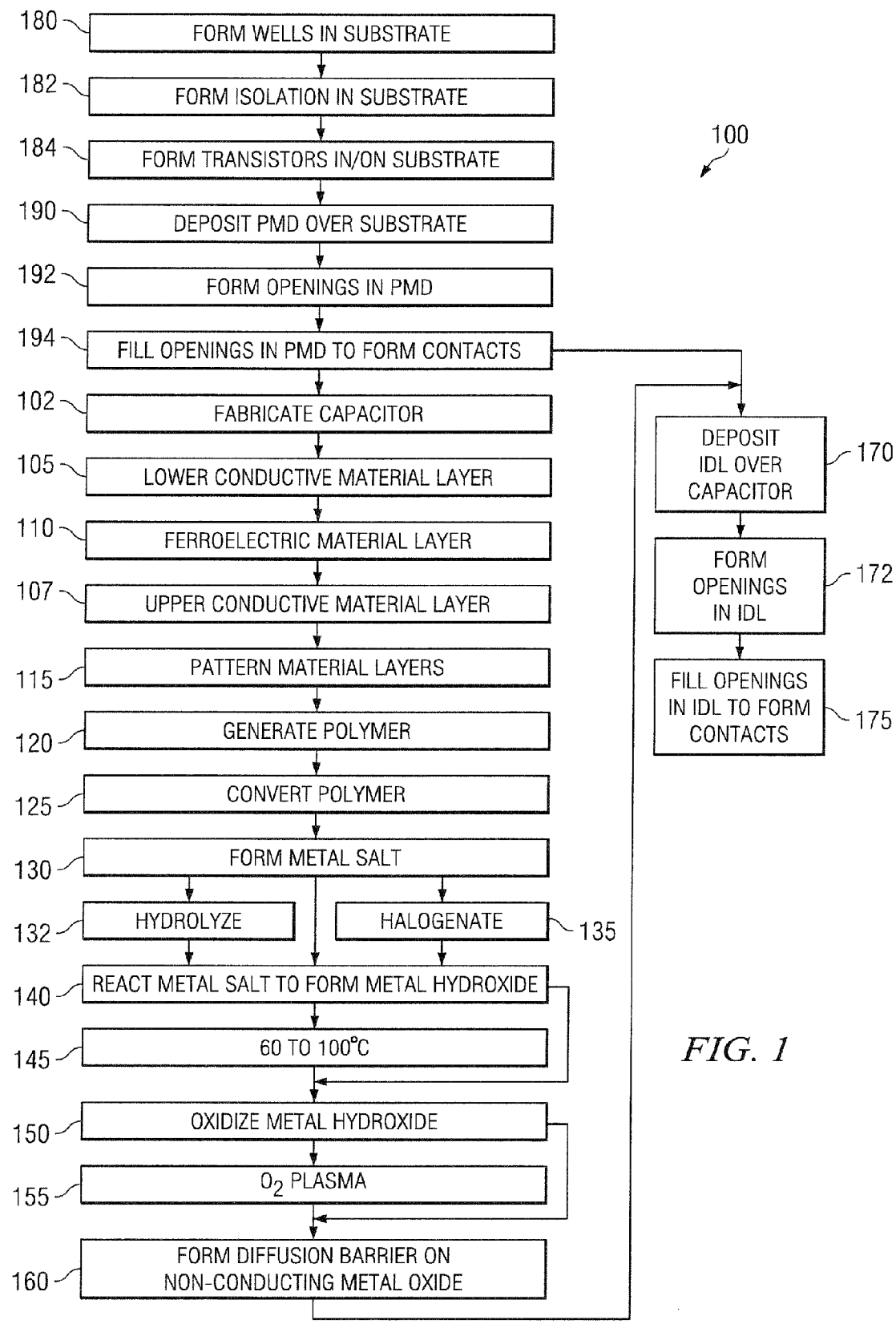
FIG. 1 is a flow diagram illustrating a method for fabricating semiconductor devices in which one or more aspects of the disclosure can be applied.

One embodiment of the disclosure is a method of manufacturing a semiconductor device. FIG. 1 is a flow diagram illustrating a method 100 for fabricating semiconductor devices in which one or more aspects of the disclosure can be applied. The method can include fabricating a capacitor (e.g., a ferroelectric capacitor) (step 102). As part of fabricating the capacitor, the method 100 can comprise forming conductive (step 105, 107) and ferroelectric material layers (step 110) on a semiconductor substrate. As depicted in FIG. 1, the layers can be formed in the sequence: form first conductive material layer (105), form ferroelectric material layers (step 110), and then form first conductive material layer (step 107). The material layers are patterned (step 115) to form electrodes and a ferroelectric layer of a ferroelectric capacitor. As a by-product of the patterning step 115, a conductive noble metal-containing polymer is generated (step 120) on the sidewalls of the ferroelectric capacitor.

The term conductive layer, as used herein, refers to a metal containing layer that comprises one or more noble metals. E.g., the conductive layers can comprise one or more pure or oxides of noble metals. There can be barrier layers between the substrate and a conductive layer, or between a conductive layer and the ferroelectric layer, or overlying the insulating layer. The term ferroelectric layer, as used herein, refers to any material layer having a permanent electric dipole moment and whose polarization can be changed by application of an electric field.

The method 100 also comprises converting (step 125) the conductive noble metal-containing polymer into a non-conducting metal oxide. Converting (step 125), the conductive noble metal-containing polymer includes forming, in step 130, a water-soluble metal salt from the conductive noble metal-containing polymer. In some cases forming (step 130) the water-soluble metal salt includes hydrolyzing the conductive noble metal-containing polymer in step 132. In other cases forming (step 130) the water-soluble metal salt includes halogenating the conductive noble metal-containing polymer in step 135.

Converting (step 125) the conductive noble metal-containing polymer further includes reacting, in step 140, the water-soluble metal salt with an aqueous acidic solution to form a hydrated metal salt via metal hydroxide intermediates. In some cases reacting (step 140) the water-soluble metal salt with the aqueous acidic solution include a step 145 of exposing the water-soluble metal salt to the aqueous acidic solution at a temperature of between about 40 and 100° C., and in some cases from about 60 to 99° C., and in still other cases from about 70 to 99° C. The use of an aqueous acidic solution adjusted to such elevated temperature ranges ensures that there is sufficient activation energy to cause rapid conversion of the water-soluble metal salt into a metal hydroxide.

Converting (step 125), the conductive noble metal-containing polymer also includes a step 150 of oxidizing the metal hydroxide to form the non-conducting metal oxide. In some cases oxidizing (step 150) includes exposing the metal hydroxide to a plasma comprising oxygen as a feed gas (step 155).

After the converting step 125, there can be several additional steps to complete the construction of the ferroelectric capacitor. E.g., one or more diffusion barriers can be formed on the sidewalls of the capacitor (step 160). The diffusion barrier can be deposited on the non-conducting metal oxide produced in the converting step 125.

After fabricating the capacitor, there can be several additional steps to complete the manufacture of the semiconductor device. Example manufacturing steps include depositing an inter-level dielectric (step 170), forming openings in the inter-level dielectric (step 172), and filling the openings with a conductive material (step 175) to form contacts configured to electrically couple the ferroelectric capacitor to other components of the semiconductor device.

Similarly, the method 100 can further include several device manufacturing steps prior to forming the capacitor in step 102. Non-limiting examples include implanting dopants to form wells in the semiconductor substrate (step 180), forming isolation structures (step 182), such as shallow trench isolation or field oxide structures, in the substrates, and forming transistors (step 184) in or on the substrate. Additional manufacturing steps can include depositing a pre-metal dielectric (PMD) layer over the transistors (step 190), forming openings in the PMD layer (step 192) and filling the openings with a conductive material (step 194) to form contacts configured to electrically couple the transistor to each other or the capacitors of the device.

FIGS. 2-8 illustrate selected steps in one embodiment of the method of manufacturing a semiconductor device in accordance with FIG. 1. The method steps of FIGS. 2-8 are presented in the context of manufacturing an integrated circuit (IC) 200. However, one skilled in the art would understand how the method could be applied to the manufacture of any semiconductor device.

Figure 2:
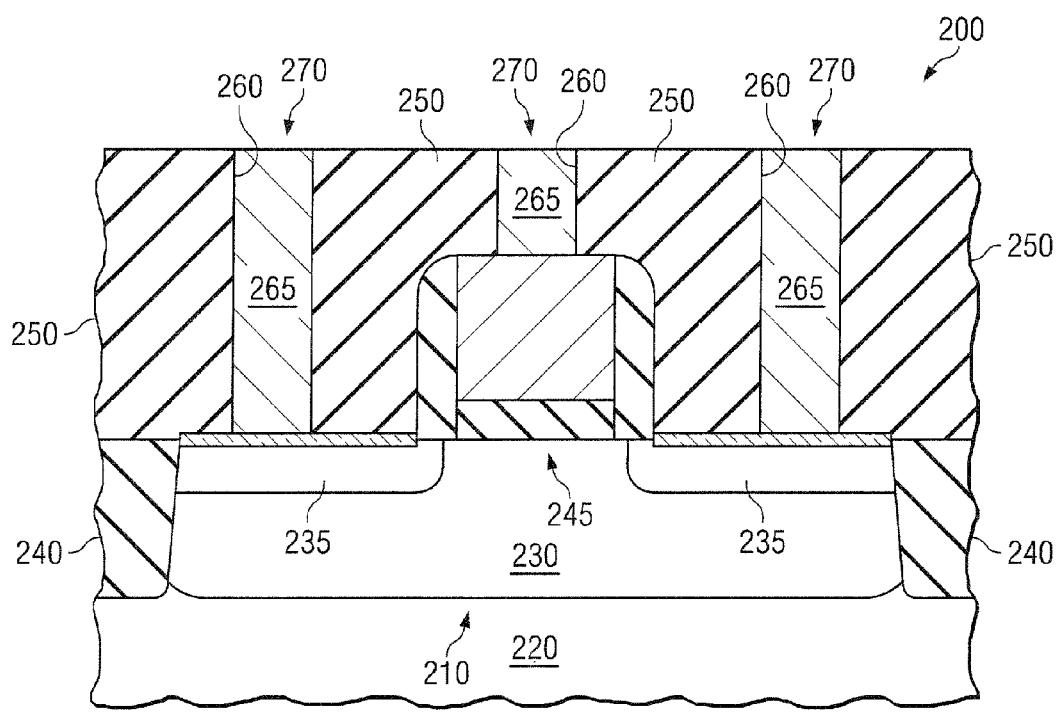
FIGS. 2 to 8 present cross-sectional views of selected steps in example implementation of a method of fabricating a semiconductor device comprising an integrated circuit according to the principles of the present disclosure.

With continuing reference to FIG. 1, FIG. 2 shows the IC 200 after forming one or more transistors 210 (e.g., nMOS, pMOS, CMOS transistors) on a semiconductor substrate 220 in accordance with step 184. Any conventional materials and methods can be used to form the transistor 210, e.g., such as discussed in U.S. patent application Ser. No. 11/016,400 by Summerfelt et al. ("Summerfelt") or in U.S. Pat. No. 6,500,678 to Aggarwal et al. ("Aggarwal"), which are incorporated herein by reference in their entirety. E.g., FIG. 2 also shows the IC 200 after forming doped wells 230, doped source and drain structures 235, shallow trench isolation structures 240, and transistor gate structures 245 in or on the substrate 220, in accordance with steps 180-184. Further examples of such steps are presented in Summerfelt or Aggarwal.

FIG. 2 also shows the IC 200 after depositing a pre-metal dielectric layer 250 over the substrate 220 and over the transistors 210 in accordance with step 190. FIG. 2 further shows the IC 200 after forming openings 260 in the pre-metal dielectric layer 250 and filling the openings 260 with a conductive material 265 to form a contact 270, in accordance with steps 192 and 194, respectively. Any suitable dielectric material and conductive material may be used for the pre-metal dielectric layer 250 (e.g., silicon dioxide), and contacts 270 (e.g., tungsten), respectively. Additional examples of suitable materials are presented in Summerfelt or Aggarwal.

Figure 3:
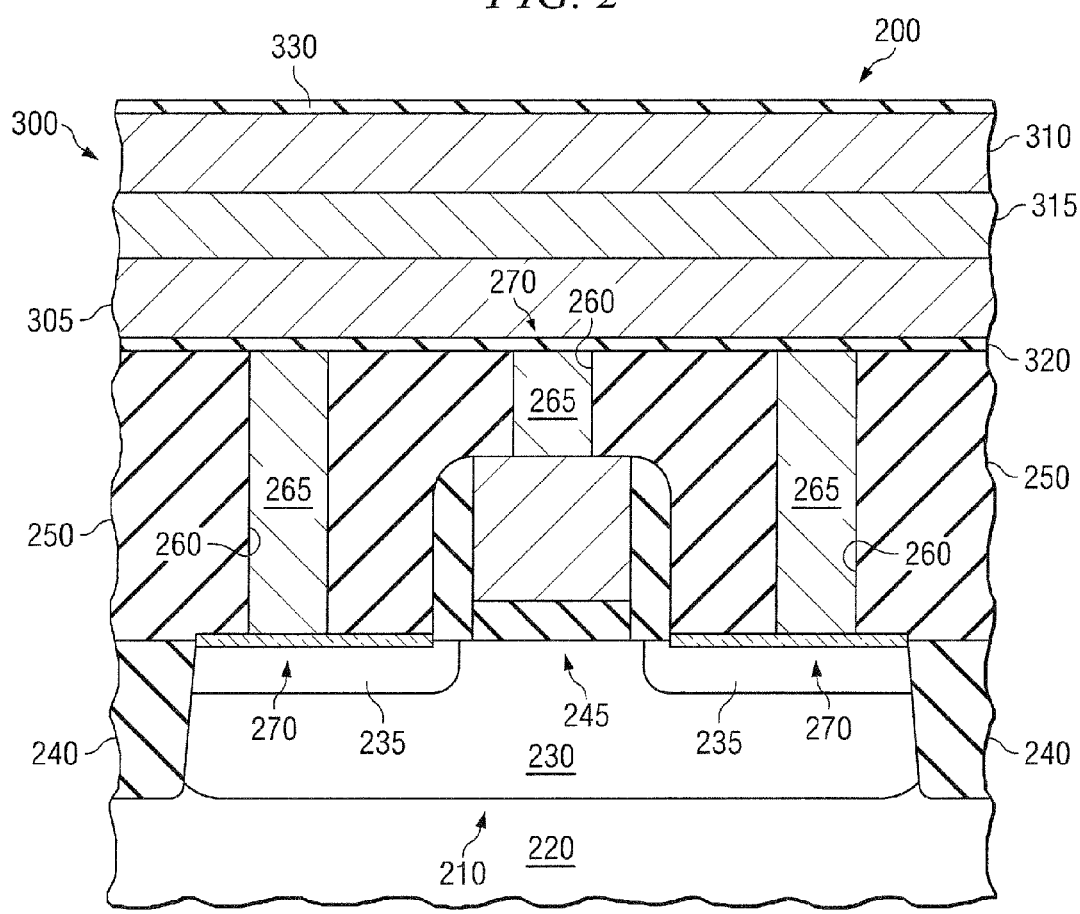
Figure 4:
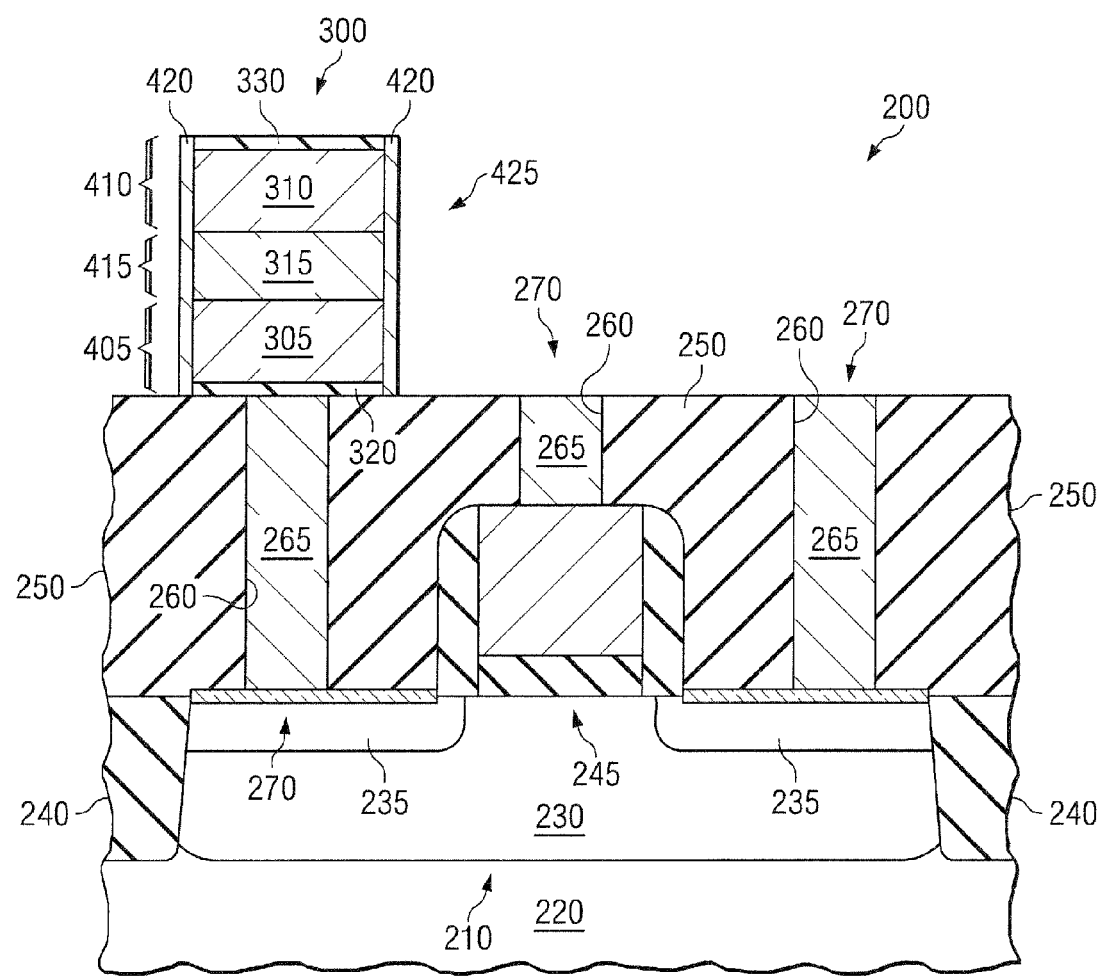

FIGS. 3 and 4 show steps in the fabricating a ferroelectric capacitor 300 on the semiconductor substrate 220. FIG. 3 shows the IC 200 after forming lower and upper conductive material layers 305, 310 and ferroelectric material layer 315 on the pre-metal dielectric layer 250, in accordance with steps 105, 107 and step 110, respectively. Forming the lower conductive material layer 305 can include depositing (e.g., chemical vapor deposition, CVD or physical vapor deposition, PVD) a lower diffusion barrier layer 320 (e.g., TiN, TaSiN, TiSiN, TiN, TaN, HfN, ZrN, HfAlN, CrN, TaAlN, CrAlN, or multilayer combinations thereof) on the pre-metal dielectric layer 250, followed by depositing the lower noble metal-containing material layer 305 (e.g., Ir, $IrO_x$, Pt, Pd, $PdO_x$, Au, Ru, $RuO_x$, Rh, $RhO_x$, $LaSrCoO_3$, $(Ba,Sr)RuO_3$, $LaNiO_3$, $YBa_2Cu_3O_{7-x}$, $AgO_x$, or multilayered combinations thereof, $x \geq 1$) on the lower diffusion barrier layer 320. Forming the ferroelectric layer 315 on the lower conductive layers 305 can include depositing (e.g., metal organic CVD) lead zirconate titanate (PZT), strontium bismuth tantalate (SBT), or other suitable materials well know to those skilled in the art. Forming the upper conductive material layer 310 on the ferroelectric layer 315 can include depositing an upper noble metal-containing material layer 310 and upper diffusion barrier layer 330. The upper noble metal-containing material layer 310 and upper diffusion barrier layer 330 can comprise similar materials as used for the lower diffusion barrier layer 320 and lower noble metal-containing material layer 305. Examples of additional suitable materials and deposition methods for forming the conductive and ferroelectric material layers 305, 310, 315 are presented in Summerfelt or Aggarwal.

FIG. 4 shows the IC 200 after patterning the material layers 305, 310, 315 (FIG. 3) in accordance with step 115, to form lower and upper electrodes 405, 410 and a ferroelectric layer 415 of the ferroelectric capacitor 300. E.g., as discussed in Summerfelt or Aggarwal, a hard mask (e.g., TiN, TiAlN, $SiO_2$ or other suitable material) in single, or multilayered combinations, can be deposited and patterned to cover portions of the underlying material layers 305, 310, 315 to thereby form an etch hard mask for subsequent etching processes to form the capacitor 300. The upper and lower noble metal-containing material layers 305, 310 and ferroelectric material layer 315 can be etched (using e.g., reactive ion etching, RIE, processes) in separate etch processes and using separate hard masks, or they can be etched using a single process and single hard mask. The RIE processes to remove uncovered portions of the material layers 305, 310, 315 can include dry plasma etching etch using feed gases of halogens (e.g., $Cl_2$), alone, or in combination with other feed gases (e.g., $O_2$, $N_2$, CO, fluorocarbons). Different components of the stack require different etch chemistries. An example RIE etch process for PZT comprises $Cl_2$:$CHF_3$:$O_2$ in sccm ratios of about 140:12:45 and RF power of about 1200 Watts and substrate bias of about 450 Watts, and a chuck temperature of about 150° C. One skilled in the art would understand the range of different etchant chemistries may be used depending on the composition of the material layers.

As further illustrated in FIG. 4, and in accordance with step 120, as a consequence of etching the material layers 305, 310, 315 (and diffusion barrier layers 320, 330, when present) a conductive noble metal-containing polymer 420 is generated on sidewalls 425 of the ferroelectric capacitor 300, as a by-product of the patterning process. The polymer 420 can cover all or a portion of the sidewalls 425, and can have variable or uniform thickness.

Figure 5:
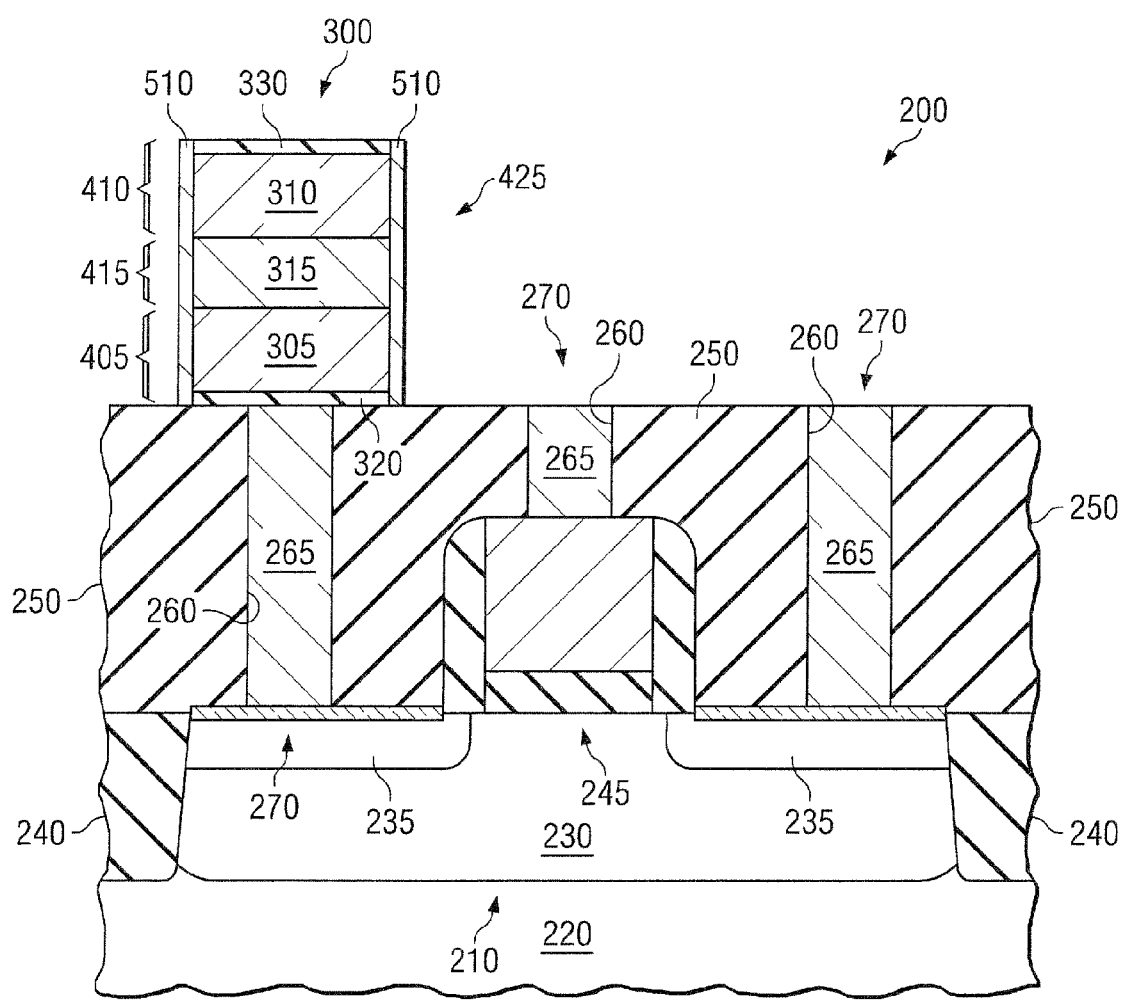
Figure 6:
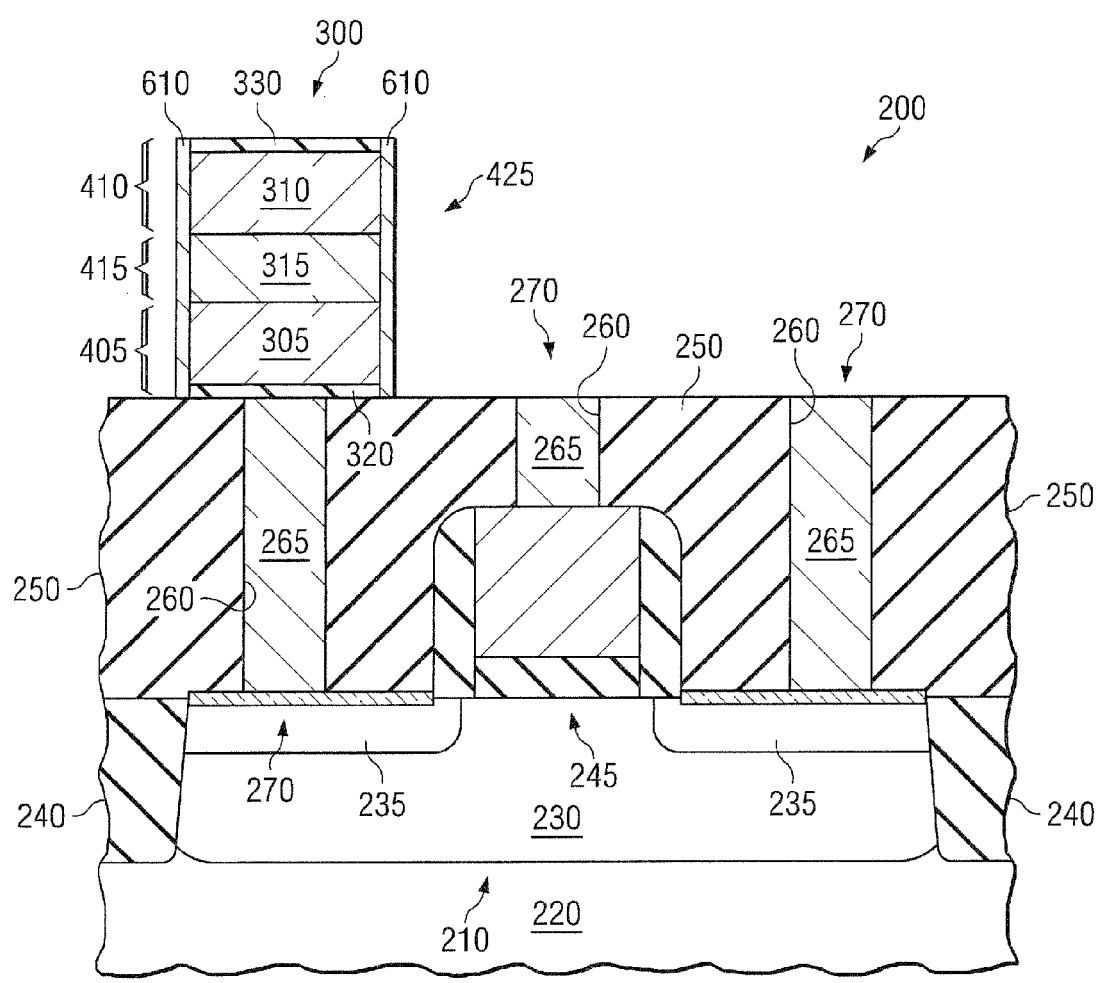
Figure 7:
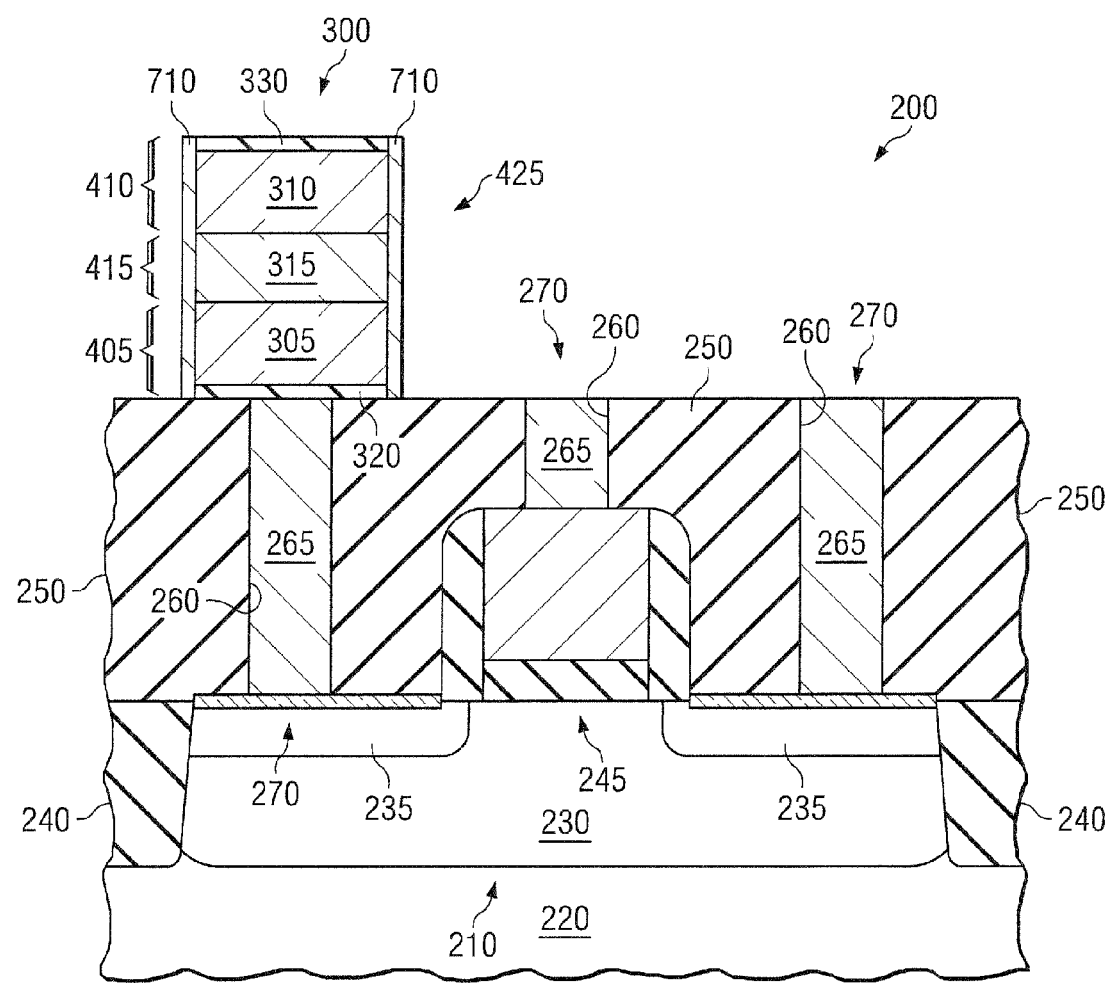

FIGS. 5-7 shows the IC 200 at different stages in converting the conductive noble metal-containing polymer 420 (FIG. 4) into a non-conducting metal oxide 710 (FIG. 7), in accordance with step 125. FIG. 5 depicts the IC 200 after forming a water-soluble metal salt 510 from the conductive noble metal-containing polymer 420 (FIG. 4), as per step 130. In some cases the metal salt 510 comprises a metal hydroxide salt, while in other cases, the metal salt 510 comprises a metal halide salt. In some cases, the metal hydroxide or metal halide salts 510 are non-conducting (e.g., a sheet resistance of about 250 Ohms/square).

With continuing reference to FIGS. 1 and 4, in some embodiments, forming the water-soluble metal salt 510 includes hydrolyzing the conductive noble metal-containing polymer 420 as per step 132. Hydrolyzing can include exposing the conductive noble metal-containing polymer 420 to a plasma generated using water ($H_2O$) as a feed gas. In some cases, e.g., the conductive noble metal-containing polymer 420 is exposed to an RF plasma generated using a $O_2:N_2:H_2O$ seem ratios of about 20:2:3 to about 40:2:5 as a feed gas, a plasma power of about 1000 to 2000 Watts, and a chuck temperature of about 50 to 350° C. In other cases, the hydrolyzing plasma can include an RF plasma generated using a feed gas of $O_2:N_2:H_2O$ in seem ratios ranging from about 3500:200:300 to about 3500:200:500, a plasma power of 1400 Watts and a chuck temperature of about 300° C for about 60 seconds. In still other cases, the hydrolyzing plasma can include an RF plasma power of about 1200 to 1600 Watts, a pressure of about 2,000 mTorr for about 0.5 to 3 minutes with feed gas comprising $O_2:N2:H2O$ in seem ratios of about 3500:200:300 and a chuck temperature of about 50 to 300° C. Excessive amounts of $H_2O$ in the feed gas (e.g., $\geq$about 500 seem) is to be avoided as this is correlated with high capacitor leakage.

In other embodiments forming the water-soluble metal salt 510 includes halogenating the conductive noble metal-containing polymer 420 as per step 135. Halogenating can include exposing the conductive noble metal-containing polymer 420 to a plasma generated using a halogen as a feed gas. E.g., the halogenating plasma can include an RF plasma power of about 800 to 1200 Watts, a pressure of about 6 to 10 mTorr for about 0.25 to 2 minutes with feed gas comprising halogens (e.g., $Cl_2$, $Br_2$ or $I_2$ plus an inert gas, such as Ar, at seem ratios of halogen:inert gas equal to about 70:50) and a chuck temperature of about 40 to 75° C. at a bias power of 100 to 200 watts.

FIG. 6 depicts the IC 200 after reacting the water-soluble metal salt 510 (FIG. 5) with an aqueous acidic solution to form a metal hydroxide 610, as per step 140. In some cases reacting comprises exposing the water-soluble metal salt 510 to the aqueous acidic solution at a temperature of between about 60 and 100° C. (step 145). This temperature range ensures sufficient activation energy to cause rapid conversion of the water-soluble metal salt 510 into a metal hydroxide 610. In some cases heating to about 60° C. only gives a marginal product, and therefore, heating to temperature of 65° C. or higher is used. Other temperatures can be used, e.g., greater than room temperature (e.g., about 25° C. or higher) but less than the boiling point of water. Reacting can be conducted in a tank or using a tank-less process, e.g., a spin washing process that comprises pouring the acid aqueous acidic solution onto the surface of a spinning substrate wafer 220 having the patterned material layers 305, 310, 315 thereon.

In some cases, reacting in step 140 includes exposing the water-soluble metal salt 510 to an acid aqueous acidic solution having about 50 wt % phosphoric acid. E.g., in some cases the water-soluble metal salt 510 can be exposed to an acid aqueous acidic solution of 1:1 $H_2O:H_3PO_4$ at about 65° C. for about about 1 to 1.5 minutes. In some cases the temperature of the solution ranges from about 45 to 80° C. and the time ranges from about 0.5 to 5 minutes, while in other cases, the temperature ranges from about 50 to 60° C.

In other cases, reacting in step 140 includes exposing the water-soluble metal salt 510 to an aqueous acidic solution having hydrochloric acid and hydrogen peroxide. e.g., 1:1:4 $H_2O:HCl:H_2O_2$ for about 0.5 to 10 minutes. In some cases aqueous acidic solution has a temperature ranging from 20 to 80° C., while in other cases, the temperature ranges from 50 to 65° C. In some cases, the duration of exposure ranges from 0.5 to 15 minutes. E.g., the water-soluble metal salt 510 can be exposed to the above $H_2O:HCl:H_2O_2$ solution at about 60° C. for about 1 to 3 minutes.

In still other cases, reacting in step 140 includes exposing the water-soluble metal salt 510 to an aqueous acidic solution having a carboxylic acid. Example carboxylic acids include EDTA, acetylacetonate, acetic acid, and oxalic acid. The aqueous acidic solution having a carboxylic acid is at a temperature ranging from about 45 to 80° C. In some instances the temperature ranges from 50 to 65° C. E.g., in some cases the water-soluble metal salt 510 is exposed to the aqueous acidic solution at about 65° C. to about 1 to 1.5 minutes. A temperature of less than about 45° C. can result in the water-soluble metal salt 510 having a nonuniform complexation of metal salt and carboxylic acid. A temperature of greater than about 80° C. can result in the complex disproportionating to undesirable by-products.

In some case, reacting in step 140 includes exchanging one or more halides of the water-soluble metal salt 510 to with one or more anionic ligands of the aqueous acidic solution. E.g., when the water-soluble metal salt 510 comprises $IrCl_2(OH)$ $3H_2O$, and the acid comprises phosphoric acid or sulfuric acid, then at least one of the Cl atoms can be exchanged with a phosphate (e.g., $PO_4^{-2}$) or a sulfate (e.g., $SO_4^{-2}$), respectively.

FIG. 7 depicts the IC 200 after oxidizing the metal hydroxide 610 (FIG. 6) to form the non-conducting metal oxide 710, as per step 150. In some cases oxidizing includes exposing the metal hydroxide 610 to a plasma comprising oxygen as a feed gas, as per step 155. E.g., an RF plasma with at least about 66% oxygen as a feed gas, and a power of least about 700 Watts. E.g., oxidizing can include an RF plasma power of about 100 to 5000 Watts, a pressure of about 50 to 5000 mTorr for about 1 to 5 minutes with a feed gas comprising $O_2$ (e.g., $O_2$ and an inert gas such as $N_2$ at sccm ratios of $O_2$: inert gas equal to about 100:1000 to 1000:1000) and a chuck temperature of about 20 to 300° C. In some cases oxidizing the metal hydroxide 610 comprises an RF plasma power of about 700 Watts with about 70% oxygen as a feed gas.

Figure 8:
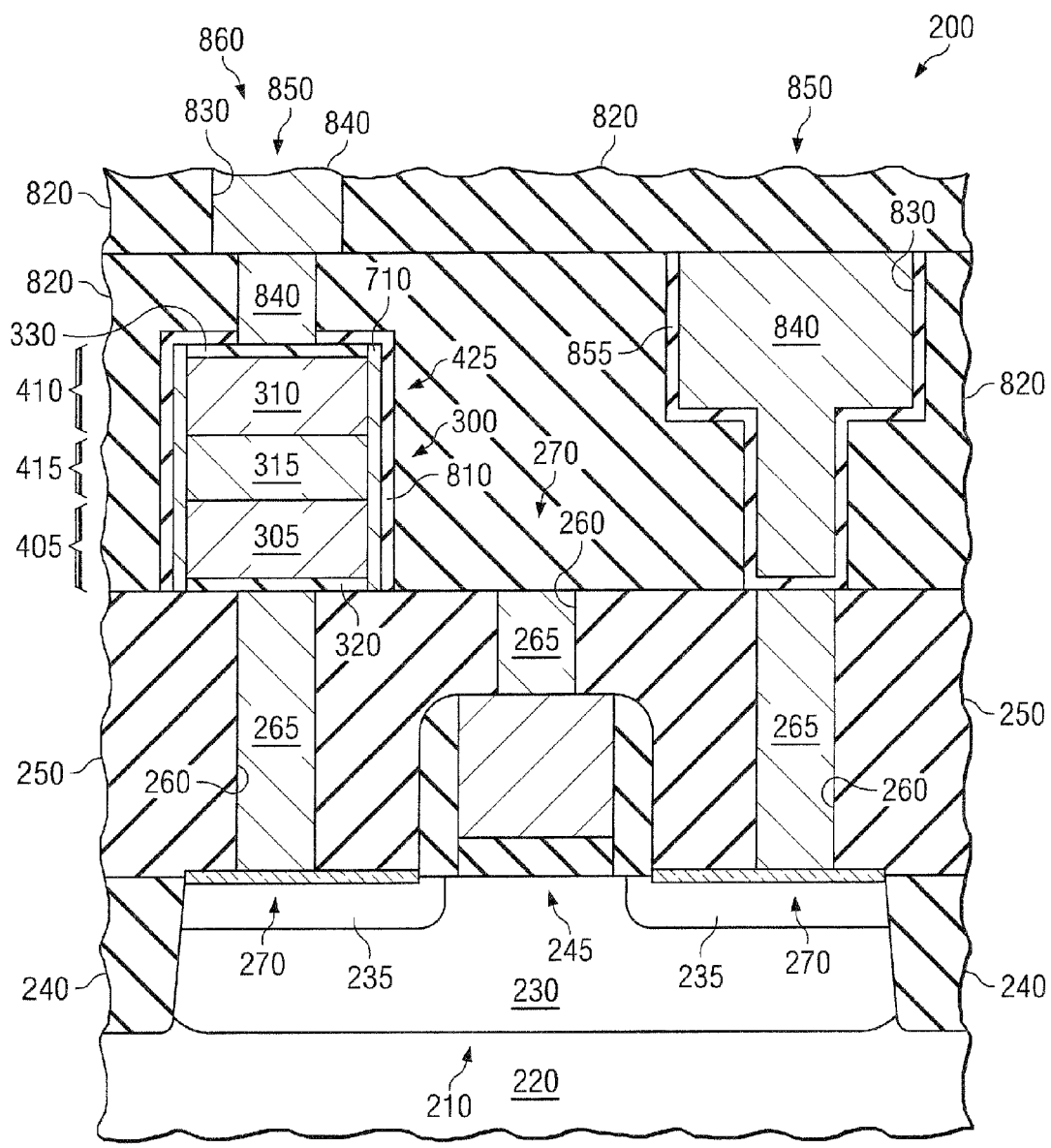

FIG. 8 shows the IC 200 after the converting step 125, and after forming a diffusion barrier 810 on the sidewalls 425 of the capacitor 300, in accordance with step 160. In addition to protecting the capacitor 300 from the diffusion of substances (e.g., a hydrogen or lead diffusion barrier) into or out of the capacitor 300, the diffusion barrier permits the misalignment of an overlying interconnect without shorting out the capacitor 300. In some cases, the diffusion barrier 810 is deposited over the entire capacitor 300, including on the non-conducting metal oxide 710. The diffusion barrier 810 can comprise a single layer or multiple layers of, e.g., $AlO_x$ ($x \geq 1$), $Ta_2O_5$, AlN, $TiO_2$, $ZrO_2$, $HfO_2$, SiN. The diffusion barrier 810 can be deposited using atomic layer deposition (ALD) plasma enhanced chemical vapor deposition (PECVD) or other deposition techniques. Further examples are presented in are presented in Summerfelt or Aggarwal.

FIG. 8 also shows the IC 200 after depositing one or more inter-level dielectric layers (ILD) 820 on the substrate 220. As shown in FIG. 8, the ILD 820 can be on the capacitor 300 and pre-metal dielectric layer 250, in accordance with step 170. Each the ILD 820 can comprise single or multi-layered combinations of insulating materials such as silicon oxide (e.g., $SiO_2$), fluorosilicate glass (FSG), phosphosilicate glass (PSG), or other low dielectric constant materials (e.g., dielectric constant of 4 or less). The ILD 820 can be deposited using CVD, PVD, ALD or other conventional methods. Additional example materials and deposition processes are presented in Summerfelt or Aggarwal.

FIG. 8 further shows forming openings 830 in the inter-level dielectric (step 172), and filling the openings 830 with a conductive material 840 (step 175) to form contacts 850. Conventional patterning and etch methods can be used to form single or dual damascene openings 830. Suitable conductive material 840 includes Al, W or Cu, and can further include a metal diffusion barrier 855 (e.g., silicon carbide or silicon nitride) lining the opening 830. Other suitable contact material and methods of forming openings and forming contacts are presented in Summerfelt or Aggarwal.

The contacts 850 can be configured to electrically couple the ferroelectric capacitor 300 to other components of the IC 200. E.g., the ferroelectric capacitor 300 can be electrically coupled to at least one of the transistors 210 through one or more contacts 850. In some embodiments, one or more transistor 210 and the ferroelectric capacitor 300 are interconnected to form a memory cell 860.

Another embodiment of the disclosure is depicted in FIG. 8, an IC 200. The IC 200 comprises one or more memory cells 860, wherein at least one of the memory cells 860, includes one or more transistors 210 on or in a semiconductor substrate 220 and the one or more capacitor 300. The IC 200 further comprises a pre-metal dielectric layer 250 over or on the one or more transistors 210 and ferroelectric capacitor 300. The ferroelectric capacitor 300 is electrically coupled to at least one of the transistors 210 and includes sidewalls 425 having a non-conducting metal oxide 710 thereon.

Embodiments of the IC 200 can be fabricated by any of the methods discussed above. E.g., the non-conducting metal oxide 710 can be generated from converting a conductive noble metal-containing polymer 420 (FIG. 4), formed on the sidewalls as a by-product of patterning materials layers 305, 310, 315 (FIG. 3) done as part of fabricating the ferroelectric capacitor 300.

The conversion can include any of the processes described in the context of steps 125-155 (FIG. 1). E.g., in one embodiment of the IC 200, e.g., forming a water-soluble metal salt 510 (FIG. 5) includes hydrolyzing the conductive noble metal-containing polymer 420 (FIG. 4) by exposing the conductive noble metal-containing polymer 420 to an RF plasma generated using a $O_2$:$N_2$:$H_2O$ seem ratio of about 3500:200:300 as a feed gas, a plasma power of about 1400 Watts, and a chuck temperature of about 150° C. Reacting the water-soluble metal salt 510 comprises exposing it to an acid aqueous acidic solution comprising about 50 wt % phosphoric acid at about 65° C. Oxidizing the resulting metal hydroxide 610 includes an RF plasma with about 70% oxygen as a feed gas and a power of about 700 Watts.

Those skilled in the art to which the invention relates will appreciate that other and further additions, deletions, substitutions and modifications may be made to the described example embodiments, without departing from the invention.

What is claimed is:

1. A method of manufacturing a semiconductor device, comprising:
    forming conductive and ferroelectric material layers on a semiconductor substrate;
    patterning said material layers to form electrodes and a ferroelectric layer of a ferroelectric capacitor, wherein a conductive noble metal-containing polymer is generated on sidewalls of said ferroelectric capacitor; and
    converting said conductive noble metal-containing polymer into a non-conducting metal oxide, including:
        forming a water-soluble metal salt from said conductive noble metal-containing polymer;
        reacting said water-soluble metal salt with an aqueous acidic solution to form a metal hydroxide; and
        oxidizing said metal hydroxide to form said non-conducting metal oxide.

2. The method of claim 1, wherein said reacting comprises exposing said water-soluble metal salt to said aqueous acidic solution at a temperature of between about 60 and 100° C.

3. The method of claim 1, wherein said reacting includes exposing said water-soluble metal salt to said acid aqueous acidic solution having about 50 wt% phosphoric acid.

4. The method of claim 1, wherein said reacting includes exposing said water-soluble metal salt to said acid aqueous acidic solution having hydrochloric acid and hydrogen peroxide.

5. The method of claim 1, wherein said reacting includes exposing said water-soluble metal salt to said acid aqueous acidic solution having a carboxylic acid.

6. The method of claim 1, wherein said reacting includes exchanging one or more halides of said water-soluble metal salt with one or more anionic ligands of said aqueous acidic solution.

7. The method of claim 1, wherein said oxidizing includes exposing said metal hydroxide to a plasma comprising oxygen as a feed gas.

8. The method of claim 1, wherein said oxidizing includes exposing said metal hydroxide to a RF plasma with at least about 66% oxygen as a feed gas, and a power of least about 700 Watts.

9. The method of claim 1, wherein said patterning said material layers includes covering portion of said material layers with a hard mask and removing uncovered portions of said material layers using a reactive ion etching (RIE) process that includes halogen, oxygen and fluorocarbon feed gases.

10. The method of claim 1, wherein said water-soluble metal salt comprises a salt selected from the group consisting of: a metal hydroxide salt, a metal hydride salt.

11. The method of claim 1, wherein said aqueous acidic solution is an aqueous solution comprising at least one acid selected from the group consisting of: phosphoric acid; sulfuric acid; hydrochloric acid; EDTA, acetylacetonate, acetic acid, oxalic acid or other carboxylic acid.

12. The method of claim 1, wherein forming said water-soluble metal salt includes hydrolyzing said conductive noble metal-containing polymer.

13. The method of claim 12, wherein said hydrolyzing includes exposing said conductive noble metal-containing polymer to a plasma generated using $H_2O$ as a feed gas.

14. The method of claim 1, wherein forming said water-soluble metal salt includes halogenating said conductive noble metal-containing polymer.

15. The method of claim 14, wherein said halogenating includes exposing said conductive noble metal-containing polymer to a plasma generated using a halogen as a feed gas.

16. A method of manufacturing an integrated circuit, comprising:
    forming one or more transistors on a semiconductor substrate;
    depositing a pre-metal dielectric layer over said transistors;
    fabricating a ferroelectric capacitor on said semiconductor substrate, wherein said ferroelectric capacitor is electrically coupled to at least one of said transistors, including:
        forming conductive and ferroelectric material layers on said pre-metal dielectric layer;
        patterning said material layers to form electrodes and a ferroelectric layer of said ferroelectric capacitor, wherein a conductive noble metal-containing polymer is generated on sidewalls of said ferroelectric capacitor; and
        converting said conductive noble metal-containing polymer into an non-conducting metal oxide, including:
            forming a water-soluble metal salt from said conductive noble metal-containing polymer;
            reacting said water-soluble metal salt with an aqueous acidic solution to form a metal hydroxide; and p3
            oxidizing said metal hydroxide to form said non-conducting metal oxide.

17. The method of claim 16, wherein forming said water-soluble metal salt includes hydrolyzing said conductive noble metal-containing polymer by exposing said conductive noble metal-containing polymer to a RF plasma generated using an $O_2:N_2:H_2O$ sccm ratio of about 20:2:3 to about 40:2:5 as a feed gas, a plasma power of about 1000 to 2000 Watts, and a chuck temperature of about 50 to 350° C.

18. The method of claim 16, wherein said reacting includes exposing said water-soluble metal salt to said acid aqueous acidic solution comprising about 50 wt% phosphoric acid at about 65° C.

19. The method of claim 16, wherein said oxidizing includes exposing said metal hydroxide to a RF plasma with about 70% oxygen as a feed gas and a power of about 700 Watts.

20. The method of claim 16, wherein said one or more transistors and said ferroelectric capacitor are interconnected to form a memory cell.

21. The method of claim 16, wherein:
    forming said water-soluble metal salt includes hydrolyzing said conductive noble metal-containing polymer by exposing said conductive noble metal-containing polymer to a RF plasma generated using an $O_2:N_2:H_2O$ sccm ratio of about 3500:200:300 to 3500:200:500 as a feed gas, a plasma power of about 1400 Watts, and a chuck temperature of about 300° C. for about 60 seconds;
    reacting said water-soluble metal salt comprises exposure to said acid aqueous acidic solution comprising about 50 wt% phosphoric acid at about 65° C.; and
    oxidizing said metal hydroxide includes a RF plasma with about 70% oxygen as a feed gas and a power of about 700 Watts.

22. A method of manufacturing a semiconductor device, comprising:
    forming one or more noble metal layers on a semiconductor substrate;
    patterning said one or more noble metal layers by etching;
    removing conductive film left by noble metal layer reaction in said etching, by oxidizing said film and complexing said oxidizing film with a labile ligand.

23. The method of claim 22, wherein said labile ligand is subsequently replaced by a stronger ligand.

24. The method of claim 23, wherein:
    forming said one of more noble metal layers comprises forming conductive and ferroelectric material layers on said semiconductor substrate;
    patterning said one or more noble metal layers comprises patterning said material layers to form electrodes and a ferroelectric layer of a ferroelectric capacitor; and
    removing said conductive film comprises removing a conductive noble metal-containing polymer generated on sidewalls of said ferroelectric capacitor by converting said conductive noble metal-containing polymer film into a non-conducting metal oxide, including:
        forming a water-soluble metal salt from said conductive noble metal-containing polymer;
        reacting said water-soluble metal salt with an aqueous acidic solution to form a metal hydroxide; and
        oxidizing said metal hydroxide to form said non-conducting metal oxide.

25. The method of claim 24, wherein said noble metal is Ir; said etching comprises a plasma etch which converts Ir to an insoluble plasma etch byproduct IRF3; said insoluble plasma etch byproduct is converted into a soluble hydrate $IrCl_2(OH)\cdot 3H_2O$ using plasma assisted passivation; such hydrate is dissolved to from a non-conducting oxide $Ir(OH)_3$; and surfaces of the sidewalls are repassivated by converting the non-conducting oxide into a high $O_2$ content IrOx through plasma assisted oxidation.

26. The method of claim 23, wherein said etching is a dry etch in the presence of oxygen.

27. The method of claim 26, wherein an oxychloride of said noble metal is converted to a chloride salt by treatment with HCL and an oxidant mixture.

28. The method of claim 27, wherein said noble metal is Pt, Ru or Ir.

* * * * *